United States Patent
Zhang et al.

(10) Patent No.: US 9,263,327 B2
(45) Date of Patent: Feb. 16, 2016

(54) MINIMIZING VOID FORMATION IN SEMICONDUCTOR VIAS AND TRENCHES

(71) Applicant: GLOBALFOUNDRIES Inc., Grand Cayman (KY)

(72) Inventors: Xunyuan Zhang, Albany, NY (US); Sean X. Lin, Watervliet, NY (US)

(73) Assignee: GLOBALFOUNDRIES INC. (KY)

( * ) Notice: Subject to any disclaimer, the term of this patent is extended or adjusted under 35 U.S.C. 154(b) by 0 days.

(21) Appl. No.: 14/310,314

(22) Filed: Jun. 20, 2014

(65) Prior Publication Data

US 2015/0371899 A1    Dec. 24, 2015

(51) Int. Cl.
*H01L 21/768* (2006.01)
*H01L 21/288* (2006.01)

(52) U.S. Cl.
CPC ........ *H01L 21/76879* (2013.01); *H01L 21/288* (2013.01); *H01L 21/76816* (2013.01); *H01L 21/76831* (2013.01); *H01L 21/76855* (2013.01); *H01L 21/76865* (2013.01)

(58) Field of Classification Search
CPC .................. H01L 21/76805; H01L 21/76808; H01L 21/76871; H01L 21/76874
See application file for complete search history.

(56) References Cited

U.S. PATENT DOCUMENTS

| | | | |
|---|---|---|---|
| 6,958,547 B2 * | 10/2005 | Dubin et al. ................... | 257/774 |
| 7,041,596 B1 * | 5/2006 | Dalton ................ | C23C 16/0245 257/E21.17 |
| 7,476,615 B2 | 1/2009 | Han et al. | |
| 7,695,981 B2 * | 4/2010 | Dai et al. ........................... | 438/1 |
| 8,536,058 B2 * | 9/2013 | Kostamo et al. .............. | 438/680 |
| 9,112,005 B2 * | 8/2015 | Gordon et al. | |
| 2003/0207560 A1 * | 11/2003 | Dubin et al. .................. | 438/629 |
| 2003/0207561 A1 * | 11/2003 | Dubin et al. .................. | 438/630 |
| 2004/0234704 A1 * | 11/2004 | Garg et al. ..................... | 427/569 |
| 2004/0250755 A1 * | 12/2004 | Ivanov et al. ................... | 118/50 |
| 2004/0253826 A1 * | 12/2004 | Ivanov et al. ................. | 438/710 |
| 2005/0009325 A1 * | 1/2005 | Chung et al. .................. | 438/637 |
| 2009/0278254 A1 * | 11/2009 | Rantala et al. ................ | 257/734 |
| 2010/0075496 A1 * | 3/2010 | Chen et al. .................... | 438/653 |

OTHER PUBLICATIONS

Yeung Au et al., "Filling Narrow Trenches by Iodine-Catalyzed CVD of Copper and Manganese on Manganese Nitride Barrier/Adhesion Layers", Journal of the Electrochemical Society 158(5): D248-D253, 2011, 26 pages.

* cited by examiner

*Primary Examiner* — Allan R Wilson

(74) *Attorney, Agent, or Firm* — Heslin, Rothenberg, Farley & Mesiti

(57) ABSTRACT

Circuit structure fabrication methods are provided which include: patterning at least one opening within a dielectric layer disposed over a substrate structure; providing a liner material within the at least one opening of the dielectric layer; disposing a surfactant over at least a portion of the liner material; and depositing, using an electroless process, a conductive material over the liner material to form a conductive structure, and the disposed surfactant inhibits formation of a void within the conductive structure.

17 Claims, 6 Drawing Sheets

MINIMIZING VOID FORMATION IN SEMICONDUCTOR VIAS AND TRENCHES

BACKGROUND

Semiconductor devices, such as integrated circuits are typically fabricated in large batches from a semiconductor wafer. In one aspect, an integrated circuit fabrication typically involves a process of depositing a conductive material into appropriately configured openings in an intermediate circuit structure, for instance, to facilitate forming conductive metal interconnect structures between interconnect layers. As the integration density of transistors continues to increase, it is desirable to reduce or minimize defects within conductive metal interconnect structures between, for instance, adjacent metal layers of respective interconnect layers, in order to maximize fabrication efficiency and enhance commercial advantage.

BRIEF SUMMARY

The shortcomings of the prior art are overcome and additional advantages are provided through the provision, in one aspect, of a method for fabricating a circuit structure. The fabricating includes: patterning at least one opening within a dielectric layer disposed over a substrate structure; providing a liner material within the opening of the dielectric layer; disposing a surfactant over at least a portion of the liner material; and depositing, using an electroless process, a conductive material over the liner material to form a conductive structure, wherein the disposed inhibits formation of a void within the conductive structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts. Further, note that, in making reference below to the drawings (which are not drawn to scale for ease of understanding) the same reference numbers used through-out different figures designate the same or similar components.

One aspect of integrated circuit fabrication typically involves a process of depositing a conductive material into appropriately configured openings in an intermediate circuit structure, for instance, to facilitate forming conductive metal structures between interconnect layers. By way of example, these conductive metal structures, often referred to as conductive lines or contact vias, facilitate the desired interconnection of semiconductor devices as required to implement a particular integrated circuit design. For instance, conductive structures such as, conductive vias may facilitate vertical electrical connection between adjacent metal layers of the integrated circuit, while conductive structures such as, conductive metal lines may facilitate electrical connections along a horizontally-extending length. However, as integration density of transistors continues to increase, the area available for providing conductive material within the configured openings continues to decrease. This decrease in available footprint area within high aspect ratio openings may often result in one or more tear-shaped voids being created within the resultant conductive metal structures. For instance, the traditional conductive structures may be formed via, for instance, any suitable conventional deposition process, such as an electroplating process. Disadvantageously, the deposition of conductive material using electroplating process may proceed with an undesirable non-uniform distribution of the conductive material within the high aspect ratio openings, resulting in a tear-shaped void being created within the resultant conductive metal structures. Such tear-shaped voids disadvantageously could result in increasing resistance, that is, increasing electrical resistance of the conductive structure which in turn, could result in increasing overall electrical resistance of the resultant device(s), leading to a performance degradation of the circuit device(s).

Figure 1:
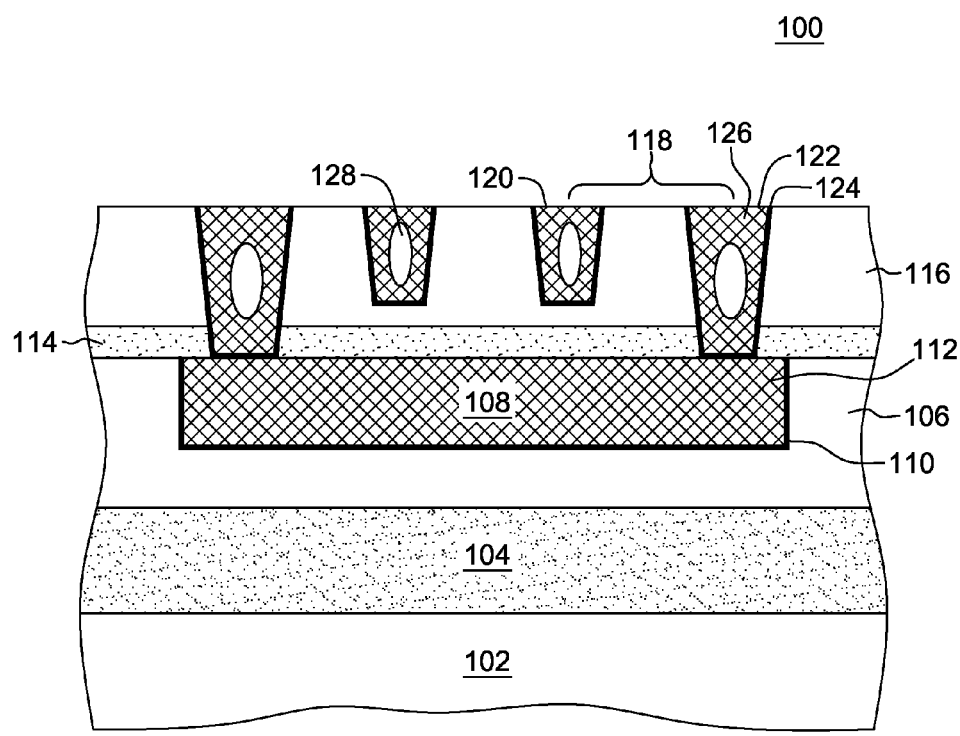
FIG. 1 depicts one embodiment of a prior-art integrated circuit structure, which includes voids within conductive structures.

By way of example, FIG. 1 depicts one embodiment of a prior-art integrated circuit structure, including an intermediate structure 100, obtained during an integrated circuit fabrication process.

In the example shown, intermediate structure 100 includes a substrate 102, such as a semiconductor substrate (for instance, a silicon substrate). As another example, substrate 102 may include any silicon-containing substrate including, but not limited to, silicon (Si), single-crystal silicon, polycrystalline Si, amorphous Si, silicon-on-nothing (SON), silicon-on-insulator (SOI), or silicon-on-replacement insulator (SRI) substrates or the like.

Intermediate structure 100 further includes individual devices which may be created during front-end of line (FEOL) processing, for instance, within a device layer 104 disposed over substrate 102. As an example, these individual devices may include, for instance, metal-oxide-semiconductor field-effect transistors (MOSFETs) such as FinFETs, as well as capacitors, resistors and other semiconductor devices. Such devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or at least partially connected) semiconductor devices may be fabricated in device layer 104.

After FEOL processing, as well as middle-of-the-line (MOL) processing, back-end of line (BEOL) processing is performed. By way of example, the BEOL processing may include, for instance, silicidation of source and drain regions, deposition of a pre-metal dielectric (PMD) layer, and formation of vias or trenches in the PMD layer. During BEOL processing, a pre-metal dielectric (PMD) layer 106 may be deposited and patterned with a network of interconnecting conductive structures (also referred to as interconnecting lines or wiring), for instance, to facilitate the desired interconnection of semiconductor devices in device layer 104 as required to implement a particular integrated circuit design. The deposition of pre-metal dielectric (PMD) layer 106, followed by subsequent processing to pattern, etch and fill trenches and vias with, for instance, conductive structures 108, may be repeated during BEOL processing such that several metal layers, for example, six to ten metal layers, are deposited and processed in a similar manner. Between each metal layer, interlayer structures may be formed to, for instance, isolate signals from the various metal layers and support structural integrity of the integrated circuit structure, including the metal layers and the interconnecting conductive structures such as trenches or vias. As an example, the interlayer structures may comprise one or more interlayer dielectrics.

By way of example, pre-metal dielectric layer 106 may be patterned using conventional etch processes, to define one or more interconnecting conductive structure(s) 108. The etch processes may include conventional anisotropic dry etching processing, for example, reactive ion etching or anisotropic wet etching processes. In one example, conductive structure 108 may include liners 110 deposited within the patterned openings. A liner refers generally to any film or layer which may include part of the resultant conductive structure, and include (for instance) one or more conformally-deposited layers, which may include titanium (Ti), carbon doped titanium, tungsten (W), tungsten nitride (WN), titanium nitride (TiN), tantalum nitride (TaN), titanium aluminum nitride (TiAlN) or the like. Liners 110 may be deposited using conventional deposition processes, for example, atomic layer deposition (ALD), chemical vapor deposition (CVD) or any other suitable process, and facilitate the forming of conductive structures 108 by filling the openings with a conductive material 112, such as a metal, such as copper, tungsten or the like. A non-selective chemical-mechanical polish may be employed to polish away excess liners 110 and conductive material 112, along with pre-metal dielectric layer 106 with the chemical-mechanical polishing terminating at, for instance, conductive structure(s) 108, resulting in the height of conductive structure 108 being substantially equal to height of pre-metal dielectric layer 106 as illustrated.

Intermediate structure 100 further includes an etch-stop layer 114 over pre-metal dielectric layer 106 and conductive structure 108 to facilitate (in one embodiment) a subsequent etching step. In one example, etch-stop layer 114 may include a nitride or an oxide material such as, for example, silicon nitride or silicon oxide, an oxynitride, a combination thereof, or any other suitable material, which may be chosen to be compatible with the etch chemistry and technique to be employed.

Continuing with FIG. 1, a dielectric layer 116 may be disposed over etch-stop layer 114. In one embodiment, dielectric material 116 may include or be fabricated of, for instance, silicon oxide ($SiO_2$), silicon nitride (SiN or $Si_3N_4$), fluorinated silicate glass (FSG). In another embodiment, dielectric layer 116 may also a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra low-k dielectric material (the dielectric constant value is less than 2.7). In one example, dielectric layer 116 may include dense or porous materials such as, for example, silicon oxide ($SiO_2$), nitrogen doped silicon carbide (SiCN), fluorine-doped amorphous silicon-oxycarbide (SiCOF), silicon oxycarbide (SiCO), silicon nitride-boron carbide ($Si_3N_4$—$B_4C$). In another example, dielectric layer 116 may also include spin-on organosilicate glass material, such as sol-gel films, for example, Nanoglass, and methylsilsesquioxane materials such as, JSR5108 or JSR5109 or LKD (available from JSR), porous SiLK (available from Dow Chemical, Midland, Mich.), and BLACK DIAMOND or BLACK DIAMOND II (available from Applied Materials), CORAL (available from Novellus), mesoporous organosilicate glass (OSG), divinylsiloxane bis-benzocyclobutene (BCB) or other organo dielectric materials having silicon-carbon-oxygen-hydrogen (SiCOH) composition.

One or more conductive structures 118 may be provided within dielectric layer 116. Conductive structures 118 may include or be fabricated of conductive materials disposed within one or more openings patterned within the dielectric layer. By way of example, in one embodiment, conductive structures 118 may include one or more conductive lines 120, which support electrical connections along a horizontally-extending length. In another embodiment, conductive structures 118 may also include one or more contact vias 122 which facilitate vertical electrical connection between BEOL metal layers of an integrated circuit. In this example, contact vias 122 may extend, for instance, through dielectric layer 116 and etch-stop layer 112 to conductive structure 108 disposed within underlying dielectric layer 106. Note that, in one example, conductive structures 118 may include liner material 124 and conductive material 126 deposited over liner material 124. A liner material refers generally to any film or layer which may include part of the conductive structure, and include (for instance) one or more conformally-deposited layers, which may include, but not limited to, titanium (Ti), an alloy of titanium such as, carbon-doped titanium, titanium nitride (TiN), titanium aluminum nitride (TiAlN), manganese (Mn), an alloy of manganese, tungsten (W), tungsten nitride (WN), tantalum (Ta), tantalum nitride (TaN), ruthenium (Ru), an alloy of ruthenium, cobalt (Co) or an alloy of cobalt or the like.

Conductive structures 118 may further include conductive material 126 disposed over liner material 124. In one embodiment, conductive material may include or be fabricated of a metal, for instance, copper which may be deposited using any suitable deposition process such as, electrochemical plating, physical vapor deposition process or dry reflow process. Although conventional deposition processes may accomplish an efficient filling of the conductive material, one skilled in the art will note that with high-aspect ratio depositions, a tear-shaped void may be created within the one or more openings. For instance, the deposition of conductive material using electroplating process may proceed with an undesirable non-uniform distribution of the conductive material within the high aspect ratio openings, resulting a tear-shaped void being created within the openings. These tear-shaped voids disadvantageously facilitate increasing the electrical resistance of the resultant conductive structures 118, which could cause undesirable localized over-heating, for instance, leading to overall performance degradation of the resultant device(s). Additionally, these tear-shaped voids may cause undesirable electromigration within the resultant semiconductor device(s), for example, integrated circuit device(s).

To address these issues, disclosed herein, in one aspect, is a method for fabricating a circuit structure. The method includes: patterning at least one opening within a dielectric layer disposed over a substrate; providing a liner material within the at least one opening of the dielectric layer; disposing a surfactant over at least a portion of the liner material; and depositing, using an electroless process, a conductive material over the liner material to form a conductive structure, where the disposed surfactant inhibits formation of a void within the conductive structure.

In one embodiment, the surfactant may be adhered to at least a portion of the liner material, without an ionic bonding with the underlying liner material. Further, the disposing includes performing a halogenation process to provide the surfactant conformally over at least a portion of the liner material, the halogenation process being performed in the presence of a organohalide precursor, for instance, ethyl iodide ($C_2H_5I$). By way of example, the halogenation process may be performed at a temperature within a range of about 20° C. to 80° C. In one example, the surfactant may include or be fabricated of a halide material such as, for instance, molecular iodine or a compound of iodine. In one example, surface density of the surfactant disposed over the at least a portion of the liner material may be within a range of about $10^{13}$ to $10^{14}$ atom/cm$^2$.

In another embodiment, the using the electroless process may include immersing, for instance, the circuit structure, in an electroless solution which includes a conductive material precursor and an ionizing source, where the ionizing source ionizes the conductive material precursor to facilitate forming the conductive structure. In one implementation, the surfactant may migrate to an upper surface of the conductive structure, subsequent to the depositing of the electroless solution. The surfactant may subsequently be removed from the upper surface of the conductive structure. In one example, the conductive material precursor may be or include, for instance, at least one of copper chloride, copper sulfate or combinations thereof and the ionizing source may be or include, for instance, at least one of phosphorus-based materials, boron-based materials or combinations thereof. In another example, the electroless process may be performed at a temperature range of about 50° C. to 80° C., and may have pH within a range of about 8 to 12.

In another embodiment, the disposing may include performing a halogenation process over the liner material to provide the surfactant, and the fabricating may further include depositing the conductive material, subsequent to the performing of the halogenation process, to facilitate forming the conductive structure. In one example, the halogenation process may be performed at a first temperature range, and the electroless process may be performed at a second temperature range, the first temperature range being substantially equal to the second temperature range. In a specific example, the first and the second temperature ranges being within a range of about 50° C. to 80° C. Additionally, in one example, the conductive material may include or be fabricated of a metal, and the liner material may be or include at least one of tantalum (Ta), an alloy of tantalum, manganese (Mn), an alloy of manganese, ruthenium (Ru), an alloy of ruthenium, cobalt, an alloy of cobalt or combinations thereof. Further, the surfactant, which may include or be fabricated of a halide material, may facilitate nucleation of the conductive material within the at least one opening, which facilitates inhibiting formation of the void within the conductive structure.

By way of example, FIGS. 2A-2J depict one example of an enhanced method for fabricating conductive metal interconnect structures such as, for instance conductive structures without formation of one or more voids disposed therein, in accordance with one or more aspects of the present invention.

Figure 2A:
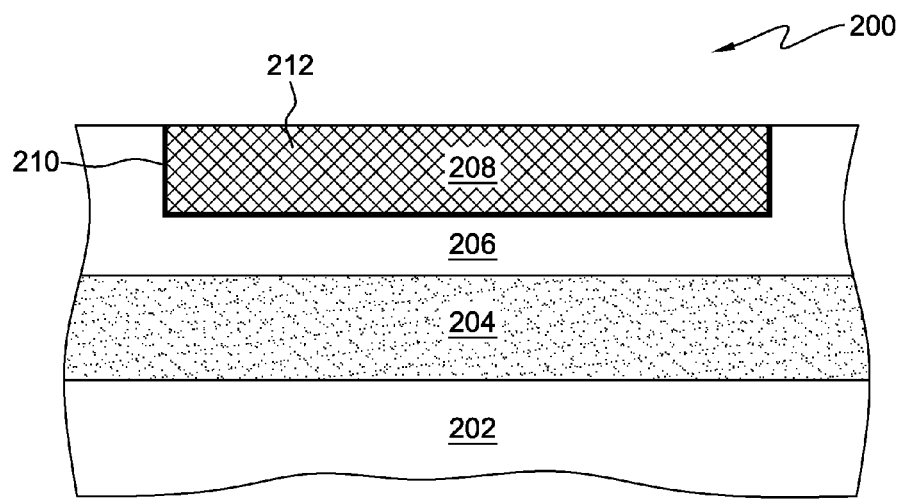
FIG. 2A is a partial cross-sectional elevational view of one embodiment of a structure, which includes a substrate, and is obtained during a fabrication process, in accordance with one or more aspects of the present invention

Beginning with FIG. 2A, a partial cross-sectional elevational view of one embodiment of an intermediate structure 200 is depicted. Intermediate structure 200 includes a substrate 202, such as a semiconductor substrate (for instance, a silicon substrate). As another example, substrate 202 may include any silicon-containing substrate including, but not limited to, silicon (Si), single-crystal silicon, polycrystalline Si, amorphous Si, silicon-on-nothing (SON), silicon-on-insulator (SOI), or silicon-on-replacement insulator (SRI) substrates or the like. The substrate may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof; or an alloy semiconductor including GaAsP, AlInAs, GaInAs, GaInP, or GaInAsP or combinations thereof.

During front-end of line (FEOL) processing, individual devices are created, for instance, in a device layer 204 disposed over substrate 202. As an example, these individual devices may include, for instance, metal-oxide-semiconductor field-effect transistors (MOSFETs) such as FinFETs, as well as capacitors, resistors and other semiconductor devices. Such devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or at least partially connected) semiconductor devices may be fabricated in device layer 204.

After FEOL processing, as well as middle-of-the-line (MOL) processing, back-end of line (BEOL) processing is performed. By way of example, the BEOL processing may include, for instance, silicidation of source and drain regions, deposition of a pre-metal dielectric (PMD) layer, and formation of vias or trenches in the PMD layer. During BEOL processing, a pre-metal dielectric (PMD) layer 206 may be deposited and patterned with a network of interconnecting conductive structures (also referred to as interconnecting lines or wiring), for instance, to facilitate the desired interconnection of semiconductor devices in device layer 204 as required to implement a particular integrated circuit design. The deposition of pre-metal dielectric (PMD) layer 206, followed by subsequent processing to pattern, etch and fill trenches and vias with, for instance, one or more conductive structures 208, may be repeated during BEOL processing such that several metal layers, for example, six to ten metal layers, are deposited and processed in a similar manner. Between each metal layer, interlayer structures may be formed to, for instance, isolate signals from the various metal layers and support structural integrity of the integrated circuit structure, including the metal layers and the interconnecting conductive structures such as trenches or vias. As an example, the interlayer structures may comprise one or more interlayer dielectrics.

By way of example, pre-metal dielectric layer 206 may be patterned using conventional etch processes, to define one or more interconnecting conductive structure(s) 208. The etch processes may include conventional anisotropic dry etching processing, for example, reactive ion etching or anisotropic wet etching processes. In one example, conductive structure 208 may include liners 210 deposited within the patterned openings. A liner refers generally to any film or layer which may include part of the resultant conductive structure, and include (for instance) one or more conformally-deposited layers, which may include titanium (Ti), carbon doped titanium, tungsten (W), tungsten nitride (WN), titanium nitride (TiN), tantalum nitride (TaN), titanium aluminum nitride (TiAlN) or the like. Liners 210 may be deposited using conventional deposition processes, for example, atomic layer deposition (ALD), chemical vapor deposition (CVD) or any other suitable process, and facilitate the forming of conductive structures 208 by the subsequent filling of the openings with a conductive material 212, such as a metal, such as copper, tungsten or the like. A non-selective chemical-mechanical polish may be employed to polish away excess liners 210 and conductive material 212, along with pre-metal dielectric layer 206 with the chemical-mechanical polishing terminating at, for instance, conductive structure(s) 208, resulting in the height of conductive structure 208 being substantially equal to height of pre-metal dielectric layer 206 as illustrated.

Figure 2B:
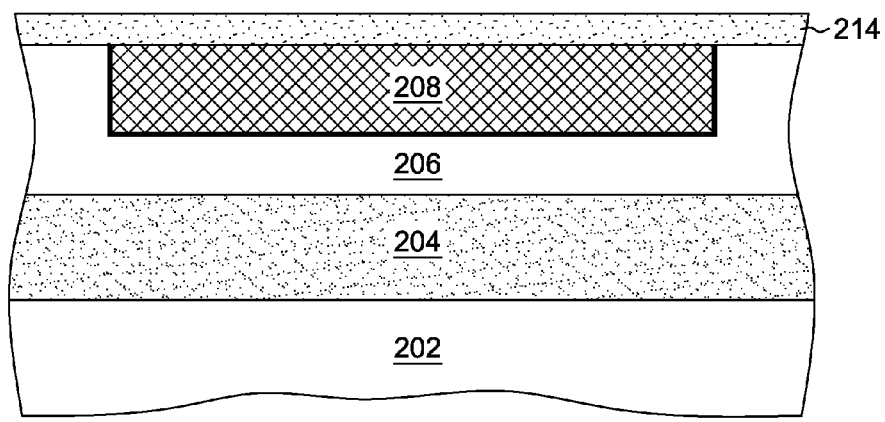
FIG. 2B depicts the structure of FIG. 2A with an etch-stop layer having been provided over the structure, in accordance with one or more aspects of the present invention.

FIG. 2B illustrates the structure of FIG. 2A after providing an etch-stop layer 214 over the structure to facilitate a subsequent etching step. In one example, etch-stop layer 214 may have a minimum thickness such that subsequent processing including an etching process for formation of opening in layers above the etch stop, will properly stop on or at etch-stop layer 214 with enough margin for error. Etch-stop layer 214, in one embodiment, may be deposited using conventional deposition processes such as, for instance, atomic layer deposition (ALD), chemical vapor deposition (CVD) or the plasma-enhanced versions of the same. In one example, etch-stop layer 214 may also include or be fabricated of materials such as, for example, silicon nitride (SiN), silicon carbide (SiC), silicon carbonitride (SiCN) or a combination thereof or any other suitable material, which may be chosen to be compatible with the etch chemistry and technique to be employed.

Figure 2C:
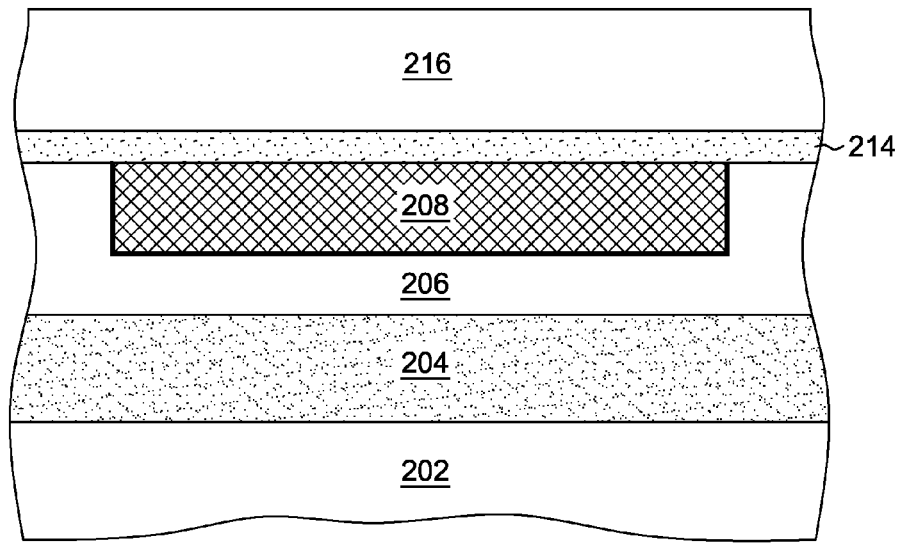
FIG. 2C depicts the structure of FIG. 2B after providing a dielectric layer over the structure, in accordance with one or more aspects of the present invention.

FIG. 2C depicts the structure of FIG. 2B after providing a dielectric layer 216 over etch-stop layer 214. Dielectric layer 216 may be deposited from a gaseous phase using any suitable conventional deposition processes, for instance, chemical vapor deposition (CVD), physical vapor deposition (PVD), atomic layer deposition (ALD) or from a liquid phase using a spin-on deposition process. In one example, dielectric layer 216 may include or be fabricated of, for instance, silicon oxide ($SiO_2$), silicon nitride (SiN or $Si_3N_4$), fluorinated silicate glass (FSG). In another example, dielectric layer 216 may also be a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra low-k dielectric material (the dielectric constant value is less than 2.7). In one specific example, dielectric layer 216 may include dense or porous materials such as, for example, silicon oxide ($SiO_2$), nitrogen doped silicon carbide (SiCN), fluorine-doped amorphous silicon-oxycarbide (Si-COF), silicon oxycarbide (SiCO), silicon nitride-boron carbide ($Si_3N_4$—$B_4C$). In another specific example, dielectric layer 216 may also include spin-on organosilicate glass material, such as sol-gel films, for example, Nanoglass, and methylsilsesquioxane materials such as, JSR5108 or JSR5109 or LKD (available from JSR), porous SILK (available from Dow Chemical, Midland, Mich.), and BLACK DIAMOND or BLACK DIAMOND II (available from Applied Materials), CORAL (available from Novellus), mesoporous organosilicate glass (OSG), divinylsiloxane bisbenzocyclobutene (BCB) or other organo dielectric materials having silicon-carbon-oxygen-hydrogen (SiCOH) composition.

Figure 2D:
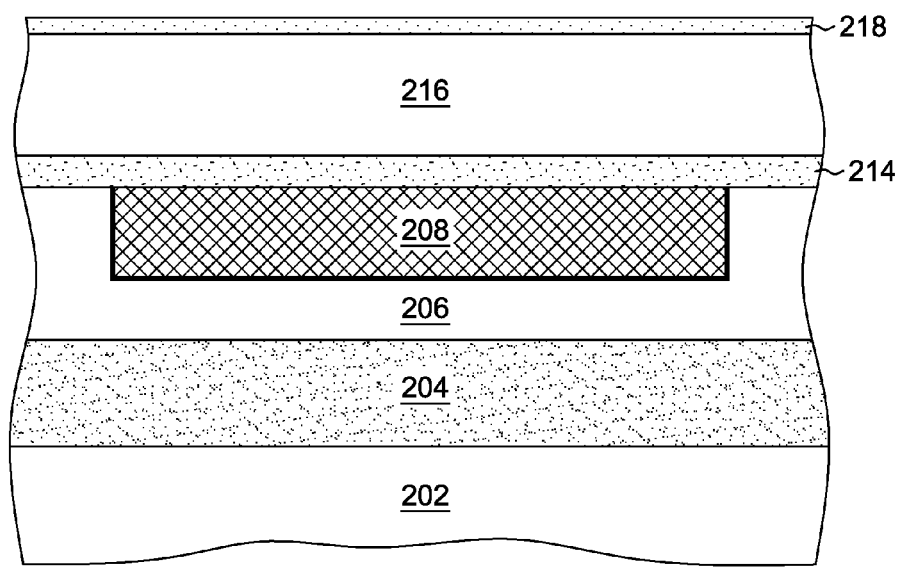
FIG. 2D depicts the structure of FIG. 2C with protective layer having been provided over the dielectric layer, in accordance with one or more aspects of the present invention.

FIG. 2D depicts the structure of FIG. 2C with protective layer 218 having been provided over dielectric layer 216. Protective layer 218 may be used, in a subsequent processing step, to support patterning and forming openings within dielectric layer 216. Protective layer 218 may be a hard-mask deposited over dielectric layer 216, and in one specific example, may include a nitride such as, for example, silicon nitride (SiN or $Si_3N_4$). The deposition process may include any conventional process such as, for example, low temperature CVD, plasma-enhanced CVD or atomic layer deposition (ALD). In one specific example, silicon nitride may be deposited using process gases such as, for example, dichlorosilane ($SiH_2Cl_2$) and ammonia ($NH_3$), and known process conditions. In another example, protective layer 218 may include or be fabricated of one or more layers of silicon-containing material or a carbon-containing material. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite). Further, protective layer 218 may also include or be fabricated of a metal or a metal-containing material such as, for example, include titanium (Ti), titanium nitride (TiN), tantalum nitride (TaN), tantalum (Ta), aluminum (Al) or aluminum-copper alloy (Al—Cu).

Figure 2E:
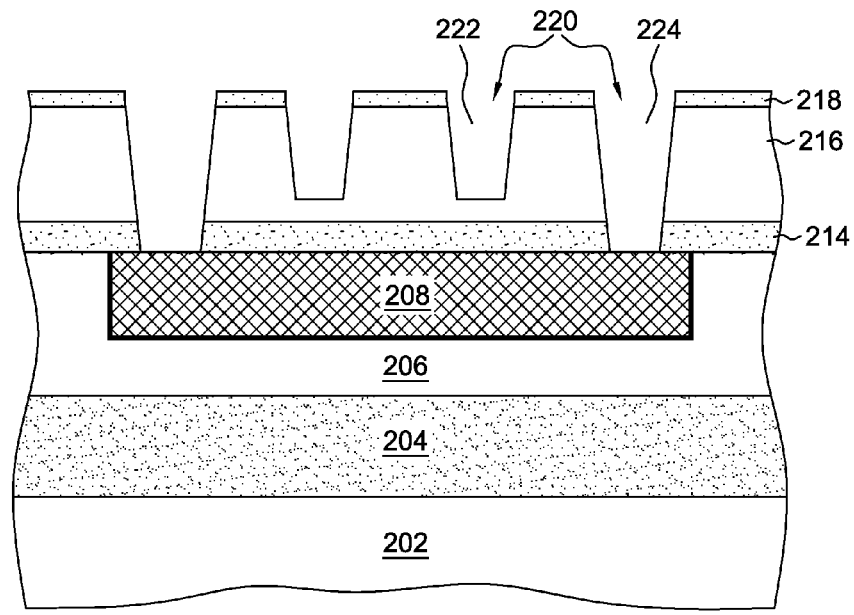
FIG. 2E depicts the structure of FIG. 2D after patterning openings in the structure, in accordance with one or more aspects of the present invention.

FIG. 2E illustrates the structure of FIG. 2D after patterning and etching, which results in removal of protective layer 218 and a portion of dielectric layer 216 to form openings 220. By way of example, openings 220 may include one or more trenches 222 extending through dielectric layer 216 to a desired depth. Such trenches 222 may be capable of being filled with a conductive structure such as one or more conductive lines, which support electrical connections along a horizontally-extending length. Openings 220 may further include one or more contact vias 224 extending through dielectric layer 216 and etch-stop layer 214 to the underlying conductive structure 208. Contact vias 224 are to be filled with conductive structures to, for example, facilitate vertical connection between BEOL metal layers of an integrated circuit. In one example, openings 220 may be formed by employing one or more lithographic processing steps, which may include, for instance, an anti-reflective coating open step and a hard-mask open step. In this example, patterning of the structure of FIG. 2E may be accomplished using any suitable lithography process. Following patterning, material removal may be performed by, for example, any suitable etch process, such as an anisotropic dry etching process, for instance, reactive ion etching (RIE) in sulfur hexafluoride ($SF_6$).

Figure 2F:
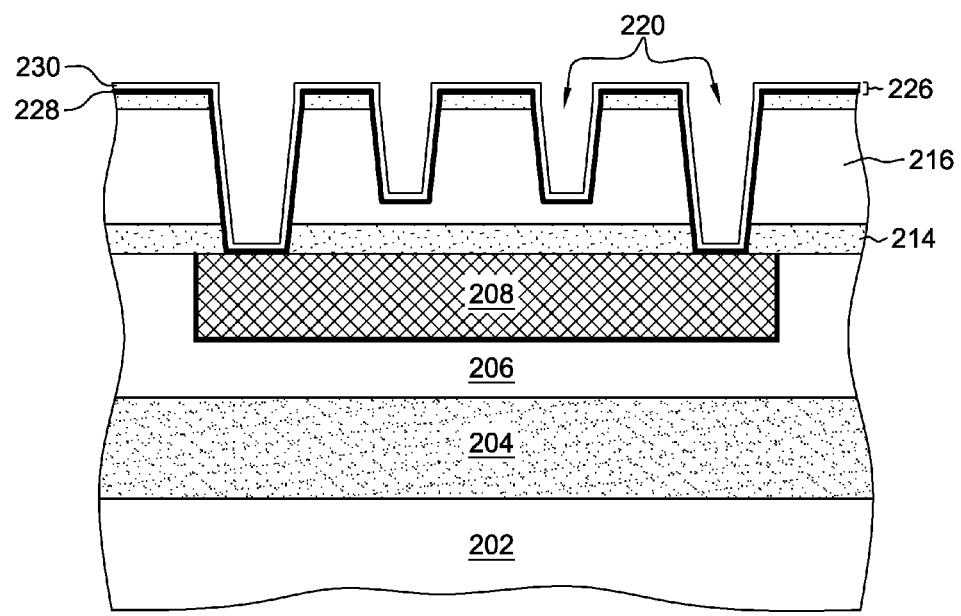
FIG. 2F depicts the structure of FIG. 2E after providing a liner material within the openings, in accordance with one or more aspects of the present invention.

Referring to FIG. 2F, one or more liner material(s) 226 may be provided, for instance, conformally within openings 220, in accordance with one or more aspects of the present invention. By way of example, liner material(s) 226, during subsequent metallization processing, facilitates inhibiting or minimizing undesirable diffusion of the conductive material into the underlying layers, as well as facilitate adherence of the conductive material to the underlying dielectric layer 216. As used herein "liner material" refers generally to any film or layer which may form part of the resultant contact structure, and may include one or more high resistive liners, such as a barrier layer 228, and a adhesive layer 230 disposed over barrier layer 228.

Barrier layer 228 may be deposited, for instance, to facilitate inhibiting or minimizing diffusion of the conductive material, during subsequent deposition process, into the underlying dielectric layer 216, thereby maintaining structural integrity of the conductive structure. Barrier layer 228 may be deposited using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods, and may have a thickness of about 1 nanometers to about 3 nanometers. In one example, barrier layer 228 may include, titanium-based materials (e.g., TiN, TiC, TiCN, TiSiN), or tantalum-based materials (e.g., TaN, TaC, TaCN, TaSiN), tungsten-based materials (e.g., WN, WC, WCN, WSiN), manganese-based materials (e.g., MnN, MnO) or combinations thereof. In a specific example, tantalum nitride (TaN) may be formed using a tantalum precursor such as, for example, pentakis(dimethylamino)tantalum (PDMAT) and a reagent plasma such as, for example, ammonia plasma during a plasma-enhanced ALD (PEALD) process.

Adhesive layer 230 may be deposited over barrier layer 228 to, for instance, facilitate adherence of the conductive material to the underlying barrier layer. In one embodiment, adhesive layer 230, which may be deposited using deposition process(es) such as, for example, chemical vapor deposition (CVD) process or atomic layer deposition (ALD) process, may have a thickness of about 1 nanometers to about 3 nanometers. By way of example, adhesive layer 230 may include or be fabricated of, for example, ruthenium (Ru), an alloy of ruthenium, cobalt (Co), an alloy of cobalt, titanium (Ti), an alloy of titanium, tantalum (Ta), an alloy of tantalum, palladium (Pd), rhodium (Rh), molybdenum (Mo) and the like. In a specific example, a ruthenium layer may be deposited using a ruthenium precursor, for instance, (2,4-dimethylpentadienyl) (ethylcyclopentadienyl) ruthenium (Ru (DMPD)(EtCp)) and a carrier gas such as, for example, carbon monoxide (CO) gas during a CVD process.

Figure 2G:
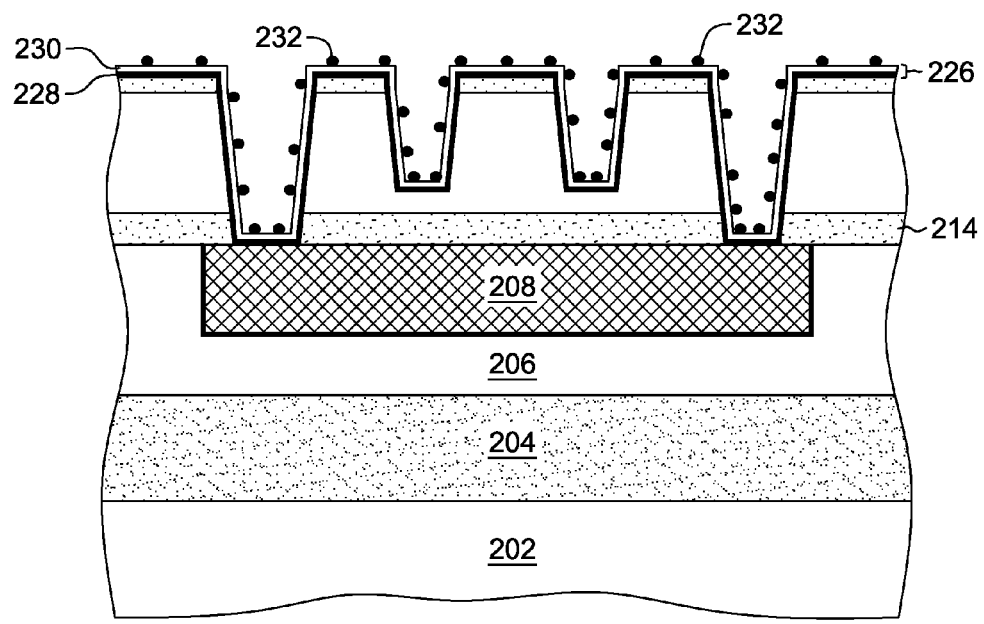
FIG. 2G depicts the structure of FIG. 2F with a surfactant having been disposed over at least a portion of the liner material, in accordance with one or more aspects of the present invention.

Referring to FIG. 2G, a conformal halogenation process may be performed over the structure, and in particular over liner material(s) 226 to form a surfactant 232, in accordance with one or more aspects of the present invention. As used herein, "surfactant" refers generally to a material or a layer of material that facilitates altering the surface diffusion activation energy of the conductive material, during subsequent fabrication processing, thereby suppressing agglomeration and enhancing growth of the conductive material over the liner material(s). By way of example, surfactant 232 may, in one embodiment, be dispersed over at least a portion of liner material(s) 226 and may include or be fabricated of a volatile halide material such as, for example molecular iodine, a compound of iodine, bromine or a compound of bromine. In one example, halogenation process may be performed using a organohalide precursor such as, for example, ethyl iodide ($C_2H_5I$), methyl iodine ($CH_3I$), diiodomethane ($CH_2I_2$), diiodoethane ($C_2H_4I_2$), propyl iodide ($C_3H_7I$) or the like. In one specific example, surfactant 232 may be adsorbed or absorbed to an upper surface of liner material(s) 226 by an evaporation method such as, for instance, heating the liquid precursor.

In one embodiment, the halogenation process may be performed at a temperature sufficient enough to form the chemically neutral molecular species (for instance, molecular iodine) of the surfactant. Surfactant 232, for example, may be adsorbed (for instance, physisorbed and/or chemisorbed) to an upper surface of the underlying liner material(s) 226 through, for instance, weak Van der Waal forces, without forming a chemical bond (for instance, ionic and/or covalent bonds) between the surfactant and the underlying liner material(s). In one example, the halogenation process may be performed at a temperature within a range of about 20° C. to 80° C. In one embodiment, the surface density of surfactant 232 disposed over at least a portion of the liner material(s) 216 may be within a range of about $10^{13}$ to $10^{14}$ atom/$cm^2$.

Figure 2H:
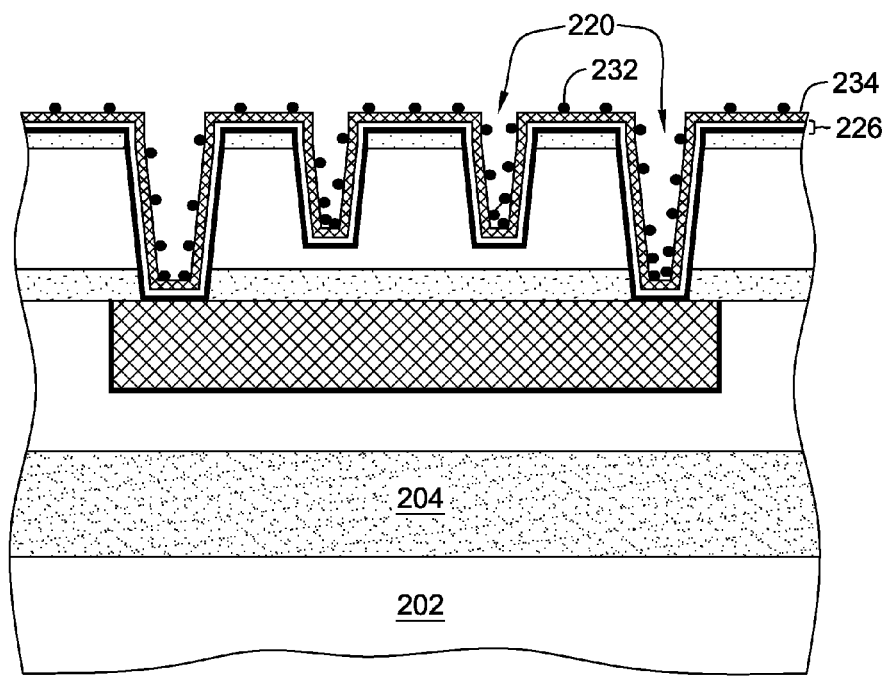
FIG. 2H depicts the structure of FIG. 2G with a conductive material having been provided over the liner material(s) using, for instance, an electroless deposition process, in accordance with one or more aspects of the present invention.

FIG. 2H depicts the structure of FIG. 2G with a conductive material 234 having been provided over liner material(s) 226 using, for instance, an electroless deposition process, in accordance with one or more aspects of the present invention. As used herein, electroless deposition process refers generally to an auto-catalytic deposition process in which aqueous metal ions may be chemically reduced to metal atoms and deposited on a substrate without the application of electrical current. As noted above, in one embodiment, liner material(s) 226 has been dispersed with at least a portion of surfactant 232. Note also that conductive material 234 may be any of a variety of conductive materials such as, tungsten, copper, aluminum, etc. In the example, discussed herein, it is assumed that the conductive material is copper.

In one example of the process, conductive material 234 has been deposited using, for instance, an electroless deposition process during which the structure may be immersed into an aqueous electroless metal plating solution. By way of example, the electroless solution may include, for instance, conductive material precursor, an ionizing source, along with additional components such as, for instance, complexing agent, inhibitor, optional additives and a pH adjusting agent. The conductive material precursor may chemically dissociate to form aqueous metal ions, which may further be chemically reduced by interacting with an ionizing source to form the conductive material. In this example, surfactant 232 dispersed over liner material(s) advantageously facilitates autocatalytic nucleation of the conductive material within one or more opening(s) 220 by catalytically initiating chemical reduction of the metal ions. The deposition of the conductive material within one or more opening(s) 220 may depend upon process parameters such as, for instance, the ionizing source, complexing agent, agitation, bath temperature and pH of the electroless solution. In one example, the electroless process may be performed at a temperature within a range of about 50° C. to 80° C. and may have a pH within a range of about 8 to 12.

As noted above, in one example, the conductive material precursor disposed within the electroless solution, may chemically dissociate to form aqueous metal ions, which may further be chemically reduced by interacting with an ionizing source to form the conductive material. This conductive material may then be deposited within one or more opening(s) 220 to form the conductive structures. In one example, conductive material precursor may include or be fabricated of precursors such as, for instance, copper sulfate ($CuSO_4$), copper chloride ($CuCl_2$), copper acetate (($CH_3CO_2)_2Cu$), copper acetylacetonate (($C_5H_7O_2)_2Cu$), derivatives thereof, hydrates thereof or combinations thereof. In one specific example, copper sulfate ($CuSO_4$) may chemically dissociate to form copper ions (for instance, cuprous ions ($Cu^{2+}$) or cupric ions ($Cu^+$)). These copper ions may chemically be reduced by interacting with an ionizing source to form copper metal, which may then be deposited within one or more opening(s) 220. As discussed above, in one example, surfactant 232 disposed over liner material(s) 226 advantageously facilitates acting as an initiator to activate the interaction between the ionizing source and the copper ions. The ionizing source, for instance, may include or be fabricated of one or more reducing agents such as glyoxylic acid or formaldehyde, phosphourus-based materials, such as, for instance, hypophosphorus acid, ammonium hypophosphite, sodium hypophosphite, or the like. Additionally, the ionizing source may also include or be fabricated of borane-based reducing agents such as, for instance, dimethylamine borane (DMAB) complex, trimethylamine borane complex, borane, diethyl amine borane (DEAB) complex, or hydrazine-based reducing agents such as, hydrazine, hydrazine sulfate, hydrazine chloride or combinations thereof.

Additionally, the electroless solution may have at least one complexing agent or chelator to form complexes with metal ions to faciliate providing stability and control during the deposition process. In one example, surfactant 232 dispersed over liner material(s) 226 may act as a complexing agent or chelator to form complexes with copper ions (for instance, cuprous ions ($Cu^{2+}$) or cupric ions ($Cu^+$)), thereby stabilizing the electroless solution which, in turn, facilitates enhancing the deposition rate of conductive copper material 234 within one or more openings 220. Additionally, this stabilizing of the electroless solution advantageously facilitates uniform distribution of the conductive material within the one or more opening(s) which, in turn, inhibits the formation of voids within the disposed conductive material. In another example, the complexing agent may have other functional groups such as carboxylic acids, dicarboxylic acids, polycarboxylic acids, amino acids, amines, diamines or polyamines. Specific examples of complexing agents may include ethylene diamine tetraacetic acid (EDTA), ethylene diamine (EDA), citric acid, citrates, glyoxylates, glycine, amino acids, derivatives thereof, salts thereof or combinations thereof.

Further, as noted above, in one embodiment, the halogenation process performed to provide the surfactant and the electroless process may be performed utilizing a common temperature range, for instance, within a range of about 50° C. to 80° C. Such low temperature processes advantageously facilitate eliminating cost-prohibitive conventional process steps, while maintaining uniform distribution of the conductive material within the one or more opening(s). Additionally note that, in one example, one or more reiterations of electroless process may be performed such that conductive material 234 may be filled to a desirable depth within one or more opening(s) 220. In such example, the deposition of conductive material may proceed, for instance, by displacing surfactant 232 adsorbed over liner material(s) 226, thereby resulting in the surfactant migrating to an upper surface of the conductive material, commensurate with the amount of the conductive material disposed within one or more opening(s) 220.

Figure 2I:
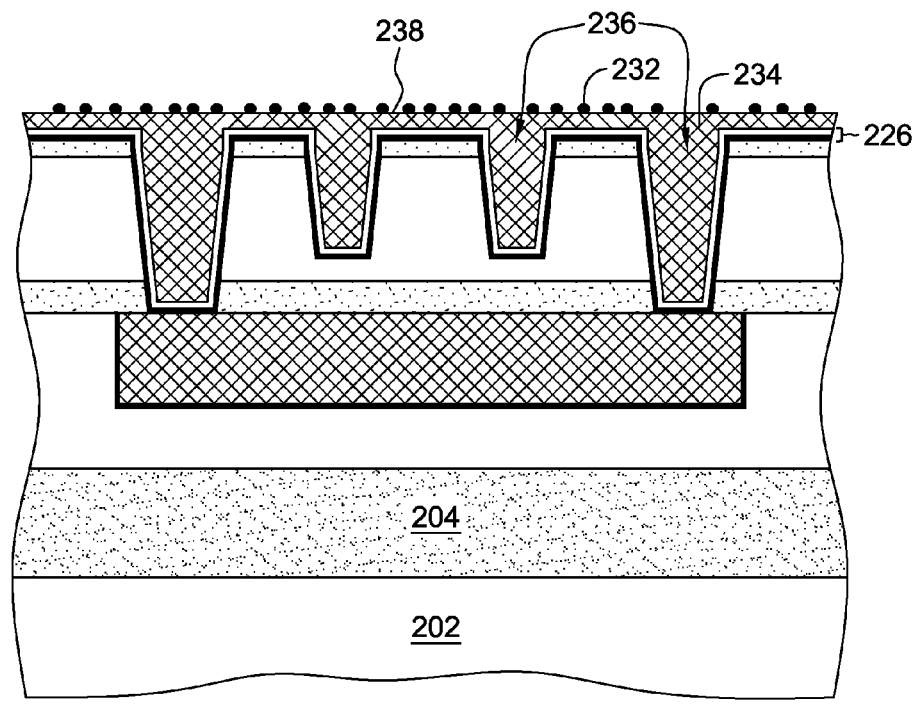
FIG. 2I depicts the structure of FIG. 2H after the surfactant having migrated to an upper surface of the conductive structure, in accordance with one or more aspects of the present invention.

FIG. 2I illustrates the structure of FIG. 2H after depositing conductive material 234 within the one or more opening(s) to form one or more conductive structures 236 and surfactant 232 having migrated to an upper surface of the conductive structure(s). As discussed above, surfactant 232 (for instance, volatile molecular iodine) advantageously facilitates uniform auto-catalytic nucleation of the conductive material within one or more opening(s) 220, as well as facilitating stabilizing the electroless solution during the deposition process, thereby enhancing the deposition rate of conductive material 234 within one or more openings 220. This, in turn, facilitates inhibiting or minimizing formation of voids within the conductive structures 236. As the deposition of the conductive material proceeds, in one embodiment, surfactant migrates to an upper surface 238 of conductive structures 236, as illustrated.

Figure 2J:
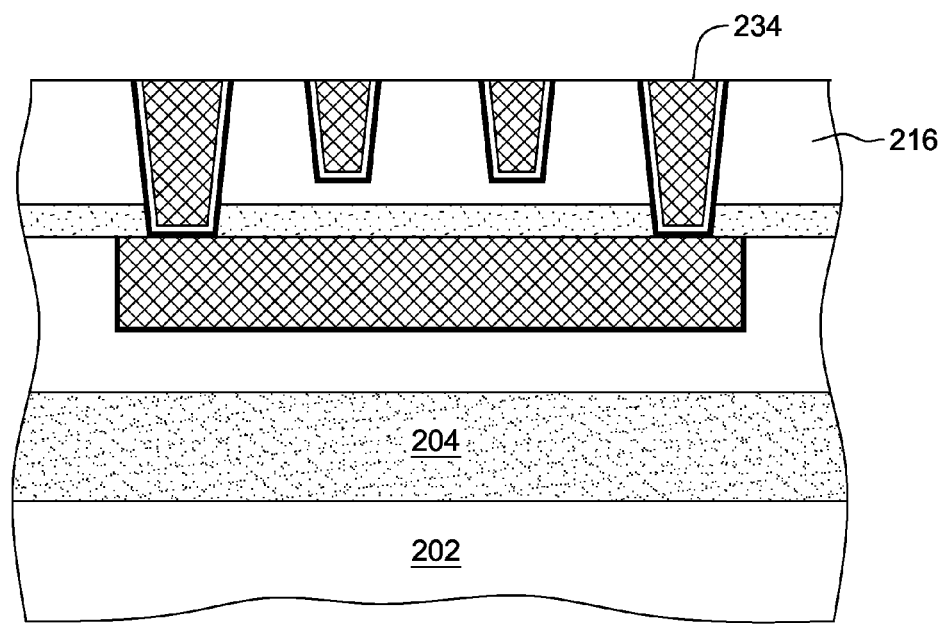
FIG. 2J depicts the structure of FIG. 2I after the removal of the surfactant and planarizing of the structure, in accordance with one or more aspects of the present invention.

As illustrated in FIG. 2J, a non-selective chemical-mechanical polish or non-selective etch-back polish may be employed to polish away excess conductive material and surfactant 232 (FIG. 2I), with the chemical-mechanical polishing terminating at, for instance, dielectric layer 216, resulting in the height of the conductive structures being substantially equal to the height of the dielectric layer, as illustrated. Alternatively, the surfactant may also be removed by annealing the structure to a temperature of about 100° C. or less upon which the volatile surfactant evaporates from the upper surface of the conductive structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating a circuit structure, the fabricating comprising:
patterning at least one opening within a dielectric layer disposed over a substrate;
providing a liner material within the at least one opening of the dielectric layer;
disposing a surfactant over at least a portion of the liner material, wherein the disposing includes performing a halogenation process; and
depositing, using an electroless process, a conductive material over the liner material to form a conductive structure, wherein the disposed surfactant inhibits formation of a void within the conductive structure.

2. The method of claim 1, wherein further comprising the surfactant to be adhered to at least a portion of the liner material, without an ionic bonding with the underlying liner material.

3. The method of claim 1, wherein the halogenation process is performed in the presence of an organohalide precursor.

4. The method of claim 3, wherein the halogenation process is performed at a temperature within a range of about 20° C. to 80° C.

5. The method of claim 1, wherein the surfactant comprises a halide material, the halide material being at least one of molecular iodine or a compound of iodine.

6. The method of claim 1, wherein the disposing comprises performing a halogenation process over the liner material to provide the surfactant, and the fabricating further comprises depositing the conductive material, subsequent to the performing of the halogenation process, to facilitate forming the conductive structure.

7. The method of claim 6, wherein the halogenation process is performed at a first temperature range, and the electroless process is performed at a second temperature range, the first and the second temperature ranges being substantially common temperature range.

8. The method of claim 7, wherein the common temperature range being within a range of 50° C. to 80° C.

9. The method of claim 1, wherein the surfactant comprises a halide material, and the surfactant facilitates nucleation of the conductive material within the at least one opening, which facilitates inhibiting formation of the void within the conductive structure.

10. A method of claim 1,
wherein the surfactant comprises a halide material, the conductive material comprises a metal, and the liner material comprises at least one of tantalum (Ta), an alloy of tantalum, manganese (Mn), an alloy of manganese, ruthenium (Ru), an alloy of ruthenium, or combinations thereof.

11. A method comprising:
fabricating a circuit structure, the fabricating comprising:
patterning at least one opening within a dielectric layer disposed over a substrate;
providing a liner material within the at least one opening of the dielectric layer;
disposing a surfactant over at least a portion of the liner material; and
depositing, using an electroless process, a conductive material over the liner material to form a conductive structure, wherein the disposed surfactant inhibits formation of a void within the conductive structure, wherein surface density of the surfactant disposed over the at least a portion of the liner material is within a range of about $10^{13}$ to $10^{14}$ atoms/cm$^2$.

12. A method comprising:
fabricating a circuit structure, the fabricating comprising:
patterning at least one opening within a dielectric layer disposed over a substrate;
providing a liner material within the at least one opening of the dielectric layer;
disposing a surfactant over at least a portion of the liner material; and
depositing, using an electroless process, a conductive material over the liner material to form a conductive structure, wherein the disposed surfactant inhibits formation of a void within the conductive structure, wherein the using the electroless process comprises immersing in an electroless solution which includes a conductive material precursor and an ionizing source, wherein the ionizing source ionizes the conductive material precursor to facilitate forming the conductive structure.

13. The method of claim 12, further comprising the surfactant migrating to an upper surface of the conductive structure, subsequent to the depositing of the electroless solution.

14. The method of claim 12, wherein the fabricating further comprising removing the surfactant from the upper surface of the conductive structure.

15. The method of claim 12, wherein the conductive material precursor comprises at least one of copper chloride, copper sulfate, copper acetate or combinations thereof, and the ionizing source comprises at least one of phosphorus-based materials, boron-based materials or combinations thereof.

16. The method of claim 12, wherein the electroless process is performed at a temperature range of about 50° C. to 80° C.

17. The method of claim 12, wherein the electroless process has a pH within a range of about 8 to 12.

* * * * *